(12) United States Patent
Quercia et al.

(10) Patent No.: US 7,579,579 B2
(45) Date of Patent: Aug. 25, 2009

(54) INTEGRATED PHOTORECEPTOR CIRCUIT AND OPTOELECTRONIC COMPONENT INCLUDING THE SAME WITH ELECTRIC CONTACT PADS ARRANGED SOLELY ON SIDE OF THE PROCESSING AREA WHICH IS JUXTAPOSED WITH THE PHOTOSENSITIVE AREA

(75) Inventors: Victorio Quercia, Vallamond (CH);
André Grandjean, Cressier (CH);
Abdul-Hamid Kayal, Neuchâtel (CH)

(73) Assignee: EM Microelectronic-Marin S.A., Marin (CH)

( * ) Notice: Subject to any disclaimer, the term of this patent is extended or adjusted under 35 U.S.C. 154(b) by 0 days.

(21) Appl. No.: 12/043,303

(22) Filed: Mar. 6, 2008

(65) Prior Publication Data

US 2008/0230679 A1 Sep. 25, 2008

(30) Foreign Application Priority Data

Mar. 21, 2007 (CH) .................................. 0451/07

(51) Int. Cl.
*H01J 40/14* (2006.01)
(52) U.S. Cl. .................................. 250/214 R; 250/230
(58) Field of Classification Search ............. 250/214 R, 250/239, 208.1, 214.1; 257/432–436, 80–85; 348/425.1
See application file for complete search history.

(56) References Cited

U.S. PATENT DOCUMENTS 6,184,516 B1    2/2001   Sawada et al.
7,084,474 B2 *  8/2006   Hung et al. ................. 257/434
2004/0251545 A1  12/2004 Tao

FOREIGN PATENT DOCUMENTS

DE   10 2005 002 352 A1   7/2006
JP            56006468    1/1981
JP             6097510    4/1994
JP          2000332228   11/2000
JP          2005223135    8/2005

OTHER PUBLICATIONS

Swiss search report issued in corresponding application No. 451/07, completed May 23, 2007.

* cited by examiner

*Primary Examiner*—Que T Le
(74) *Attorney, Agent, or Firm*—Griffin & Szipl, P.C.

(57) ABSTRACT

The integrated photoreceptor circuit includes a photosensitive area for picking up light and a processing unit area for processing the signals provided by the photosensitive area. This photoreceptor circuit includes electric contact pads, which are arranged symmetrically solely on the side of the processing unit area, which is juxtaposed with the photosensitive area. The integrated photoreceptor circuit is mounted on a first portion of a flexible substrate. The contact pads of the integrated photoreceptor circuit are electrically connected to electrical connection pads of the printed circuit of the flexible substrate. A second portion of the flexible substrate carries electrical connection terminals, which are connected to the connection pads via conductive paths, arranged in part on a connecting portion between the first and second portions. A through aperture in the first portion may be provided opposite the photosensitive area only of the photoreceptor circuit.

9 Claims, 3 Drawing Sheets

INTEGRATED PHOTORECEPTOR CIRCUIT AND OPTOELECTRONIC COMPONENT INCLUDING THE SAME WITH ELECTRIC CONTACT PADS ARRANGED SOLELY ON SIDE OF THE PROCESSING AREA WHICH IS JUXTAPOSED WITH THE PHOTOSENSITIVE AREA

This application claims priority from Swiss Patent Application No. 00451/07 filed Mar. 21, 2007, the entire disclosure of which is incorporated herein by reference.

FIELD OF THE INVENTION

The invention concerns an integrated photoreceptor circuit, which includes a photosensitive area for picking up light and a processing unit area for processing the signals provided by the photosensitive area.

The invention also concerns an optoelectronic component, which includes the integrated photoreceptor circuit.

BACKGROUND OF THE INVENTION

An integrated photoreceptor circuit can generally be made in a silicon semiconductor substrate. The photosensitive area of the photoreceptor circuit can include an array or matrix of photosensitive elements, such as photodiodes, or a particular configuration of several adjacent photosensitive elements. The processing unit of the photoreceptor circuit processes the signals supplied by the elements of the photosensitive area, while taking account of the quantity of light picked up by each photosensitive element.

Usually, in order to make a photoreceptor circuit, portions of the processing unit area can surround the photosensitive area. With this distribution of the two areas of the photoreceptor circuit, the electric contact pads of the photoreceptor circuit are generally distributed all around the photosensitive area for example in a uniform manner, which leads to a waste of space. This arrangement of the contact pads may also depend upon an electrical connection to corresponding contact pads of a conventional support on which the photoreceptor circuit may be mounted.

Some of the contact pads of the photoreceptor circuit mounted on the support or a connection grid are each connected by a metal wire to a corresponding connection pad of the support or the connection grid. Once the electrical connection has been established with the used contact pads of the photoreceptor circuit, an encapsulation operation recovers at least the processing unit area, which could be sheltered from light. A light passage is, however, left above the photosensitive area.

When integrated photoreceptor circuits of the prior art are made, as indicated above, no measures are taken as regards the placing of the contact pads and photoreceptor circuit areas in order to reduce the size of the circuit. The placing of the contact pads is generally devised to facilitate assembly on a support or a grid to obtain a conventional optoelectronic module or component of well defined size. This type of conventional optoelectronic module or component can take the form, for example, of a DIL or SOIC type component. Consequently, the photoreceptor circuit is not made in an optimum manner to satisfy current requirements to reduce the size of any optoelectronic component made, which is a drawback.

SUMMARY OF THE INVENTION

It is thus an object of the invention to provide an integrated photoreceptor circuit that overcomes all the drawbacks of the aforecited prior art, wherein the particular arrangement of the various elements allows the size of the photoreceptor circuit to be reduced and certain parts of the circuit to be made symmetrical or balanced.

The invention therefore concerns an integrated photoreceptor circuit, which includes features in accordance with a first embodiment. According to the first embodiment of the invention, an integrated photoreceptor circuit includes a photosensitive area with several adjacent photosensitive elements for picking up light and a processing unit area for processing the signals supplied by the photosensitive elements of the photosensitive area, electric contact pads, being arranged solely on the side of the processing unit area, which is juxtaposed with the photosensitive area, wherein the contact pads are arranged symmetrically in the processing unit area, and wherein at least some contact pads are distributed in two rows at the periphery of the two opposite sides of the processing unit area, arranged along the length of the two juxtaposed areas.

Other specific embodiments of the integrated photoreceptor circuit are defined by embodiments two to six. In accordance with a second embodiment of the present invention, the first embodiment is modified so that all of the contact pads are distributed in the two rows in equal numbers in each row. In accordance with a third embodiment of the present invention, the first embodiment is modified so that the contact pads of each row are uniformly distributed and regularly spaced from each other over the entire length of each opposite side of the processing unit area. In accordance with a fourth embodiment of the present invention, the first embodiment is modified so that the contact pads of each row are grouped to define packets of contact pads, which are uniformly distributed and regularly spaced from each other over the entire length of each opposite side of the processing unit area. In accordance with a fifth embodiment of the present invention, the first embodiment is modified so that first contact pads distributed in the two rows are grouped in packets of contact pads, which are regularly spaced from each other, and wherein second contact pads are arranged on one side of the processing unit area, opposite a side connecting the two areas, the first and second contact pads being symmetrically distributed relative to a median line along the length of the integrated photoreceptor circuit. In accordance with a sixth embodiment of the present invention, the first embodiment is modified so that metal bumps are made above the contact pads of the photoreceptor circuit to project from a passivation layer on the semiconductor substrate of the photoreceptor circuit.

One advantage of the integrated photoreceptor circuit according to the invention lies in the fact that the contact pads of the entire circuit are arranged only in the processing unit area, leaving the photosensitive area free. The photosensitive area is juxtaposed with one side of the processing unit area to define two distinct areas in the same semiconductor substrate, for example made of silicon.

Advantageously, the contact pads are distributed symmetrically in the processing unit area for example in two peripheral rows, arranged along the length of the two juxtaposed areas. An equal number of contact pads for electrical connection, which are regularly or symmetrically spaced from each other, can be provided in each row.

Advantageously, metal bumps are made on the contact pads to project from a passivation layer of the integrated photoreceptor circuit. These metal bumps, which are symmetrically distributed in the processing unit area, are for direct connection to corresponding contact pads of a printed circuit substrate or support by a flip chip technique. In order to do this, the connection pads of the substrate have the same arrangement and position as the metal bumps. Owing to this arrangement of metal bumps in the processing unit area, the assembly force of the circuit onto the substrate is applied only on the back of the processing unit area, leaving the photosensitive area free and without any assembly mechanical stress. The contact pressure due to the assembly force of the circuit with metal bumps onto the substrate is thus distributed in a suitable manner or in a balanced way. A reliable assembly is thus achieved while leaving the photosensitive part of the integrated circuit floating.

It is also an object of the invention to provide an optoelectronic component that includes an integrated photoreceptor circuit of reduced size and with certain symmetrized parts.

The invention therefore concerns an optoelectronic component, which includes features mentioned in accordance with a seventh embodiment. The seventh embodiment of the present invention pertains to an optoelectronic component including an integrated photoreceptor circuit such as according to that of the first embodiment, wherein the component includes a flexible printed circuit substrate on which the photoreceptor circuit is mounted and electrically connected, wherein the integrated photoreceptor circuit includes metal bumps on the contact pads, which are connected, by means of an assembly force of the circuit on the substrate, applied solely to the back of the processing unit area, to electrical connection pads of a first portion of the substrate having the same arrangement and position as the metal bumps of the integrated photoreceptor circuit.

Other specific embodiments of the optoelectronic component are defined in embodiments eight and nine of the invention. In accordance with an eighth embodiment of the invention, the seventh embodiment is modified so that the flexible substrate includes a second portion, which carries electrical connection terminals, and a connecting portion between the first and second portions, conductive paths arranged on a first face and/or a second face of each portion of the flexible substrate, connecting certain connection pads to the connection terminals. In accordance with a ninth embodiment of the present invention, the seventh embodiment is modified so that a through aperture is provided in the first portion opposite the photosensitive area only of the photoreceptor circuit.

One advantage of the optoelectronic component according to the invention lies in the fact that it includes connection pads on a printed circuit substrate for connection to contact pads of the integrated photoreceptor circuit arranged opposite the processing unit area of the circuit. Thus, during an operation of electrically connecting the contact pads of the circuit to the connection pads of the substrate, any mechanical contact with the photosensitive area is avoided, leaving the latter free in order to protect it.

Advantageously, the substrate of the optoelectronic component is a flexible substrate. This flexible substrate includes a first portion on which the integrated photoreceptor circuit is mounted, a second portion carrying electrical connection terminals of the component, and a third connecting portion between the first and second portions. This third portion carries conductive paths connecting the connection terminals of the second portion to the connection pads of the first portion of the flexible substrate.

Advantageously, if the integrated photoreceptor circuit includes metal bumps, the first portion of the flexible substrate includes connection pads having the same arrangement and position as the metal bumps. In this manner, the integrated photoreceptor circuit can be mounted on the first portion by a flip chip technique, using a force applied only to the back of the processing unit area. Owing to the arrangement of the metal bumps of the circuit and the first portion of the substrate, this ensures a reliable assembly of the circuit on the substrate.

A through aperture can thus be provided in the first portion of the substrate, opposite only the photosensitive area to allow it to pick up light freely. Preferably, only the processing unit area can be encapsulated in a resin or under an electrically insulating cover, opaque to light, in order to shelter this area from light.

BRIEF DESCRIPTION OF THE DRAWINGS

The objects, advantages and features of the integrated photoreceptor circuit, in addition to the optoelectronic component comprising the same, will appear more clearly in the following description of non-limiting embodiments illustrated by the drawings, in which.

DETAILED DESCRIPTION OF THE INVENTION

In the following description, all of the parts of the integrated photoreceptor circuit or the optoelectronic component that are well known to those skilled in the art are explained only in a simplified manner.

Figure 1A:
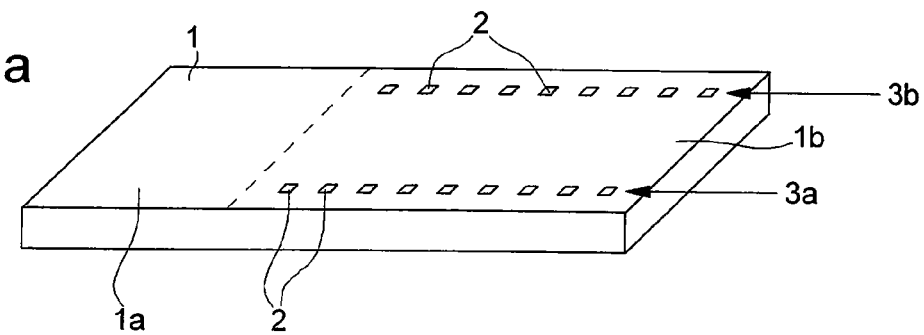
FIGS. 1a, 1b and 1c show a simplified three-dimensional view of three embodiments of the integrated photoreceptor circuit according to the invention.
Figure 1B:
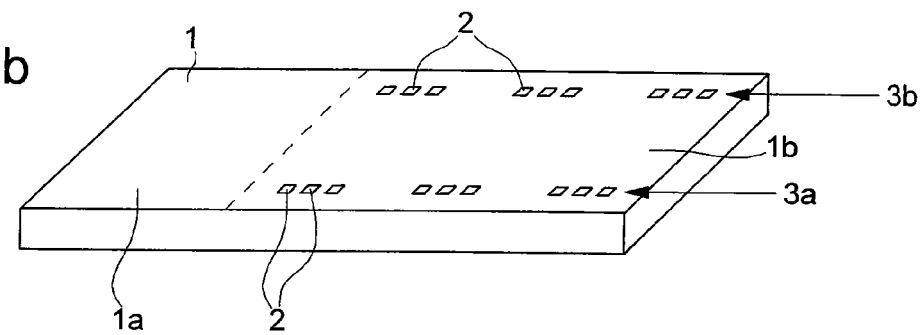
Figure 1C:
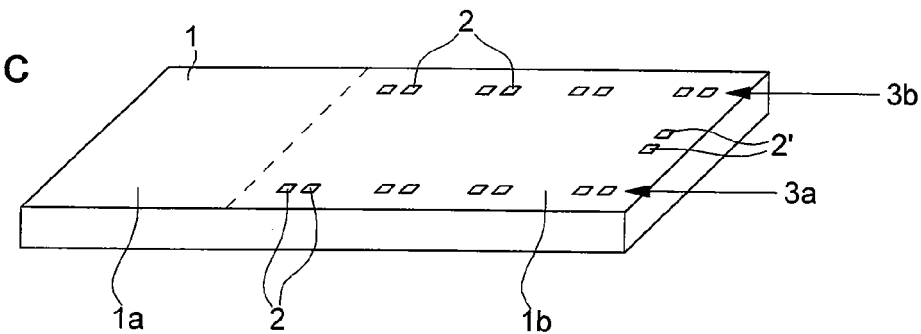

In FIGS. 1a, 1b and 1c, the integrated photoreceptor circuit 1 is made in a semiconductor substrate, such as a silicon substrate. It includes, in particular, a photosensitive area 1a, which includes several photosensitive elements that are not shown, such as photodiodes, and a processing unit area 1b for processing the electrical signals supplied by the elements of the photosensitive area. Photosensitive area 1a is directly juxtaposed with one side of processing unit area 1b as shown by the dotted lines in FIGS. 1a, 1b and 1c. Preferably, the surface of this photosensitive area 1 can be half of the surface of processing unit area 1b.

Processing unit area 1b includes all of contact pads 2, 2' of the photoreceptor circuit according to the invention, which may be electrically connected to the exterior. These contact pads can be distributed symmetrically in the processing unit area. Contact pads 2 are for example distributed in two rows 3a and 3b on the periphery of two opposite sides of processing unit area 1b along the length of the two juxtaposed areas. In FIG. 1c, contact pads 2' may also be arranged on the periphery on one side of the processing unit area, opposite the connecting side of the two areas. Of course, all of contact pads 2 and 2' are distributed symmetrically relative to a median line along the length of the integrated photoreceptor circuit.

The number of contact pads 2 of each row is preferably equal. Contact pads 2 of each row may be regularly spaced over the entire length of processing unit area 1b as shown in FIG. 1a. For example, 18 contact pads could be provided, including 9 contact pads 2 per row 3a, 3b. The width of each contact pad may be 100 μm, whereas the space between each pad of the same row could be 200 μm.

Of course, other configurations or arrangements of the contact pads could be provided in the processing unit area provided that they are distributed symmetrically in the area 1b. They may for example be grouped in regularly spaced packets on each opposite side of the processing unit area as shown in FIG. 1b. They could also be shifted in relation to each other on the two sides of the processing unit area 1b. This symmetry of pad arrangement may be necessary in order to assemble the photoreceptor circuit reliably on a printed circuit support by a flip chip technique.

In FIG. 1c, some contact pads 2 are distributed on two rows 3a and 3b and grouped in packets of two contact pads 2 for example, which are regularly spaced from each other. Other contact pads 2', for example two contact pads, may be distributed on the side of the processing unit area opposite the connecting side of the two areas 1a and 1b. All of contact pads 2, 2', shown in FIG. 1c, are symmetrically distributed relative to a median line along the length of the integrated photoreceptor circuit.

Figure 2:
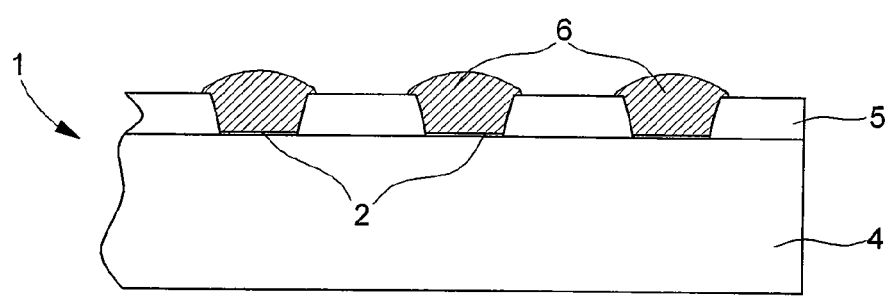
FIG. 2 shows a partial vertical cross-section of one part of the processing unit area of the integrated photoreceptor circuit according to the invention.

For a flip chip assembly, integrated photoreceptor circuit 1 may include metal bumps 6 made on contact pads 2 as shown in FIG. 2. Contact pads 2 are made in a conventional manner on semiconductor substrate 4. Apertures in the final passivation layer 5 deposited on substrate 4 are provided to give access to each contact pad 2 of integrated photoreceptor circuit 1. Metal bumps 6 are thus made through the apertures of passivation layer 5 from each contact pad 2 in order to project from the top surface of the passivation layer.

Figure 3:
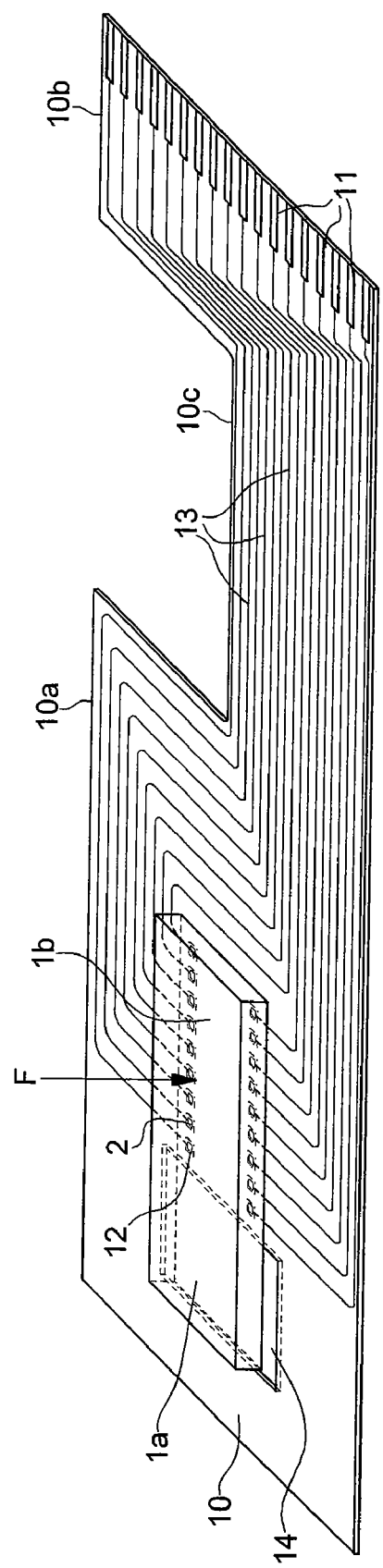
FIG. 3 shows a simplified three-dimensional view of a first embodiment of the optoelectronic component according to the invention.

FIG. 3 shows a three-dimensional view of a first embodiment of an optoelectronic component. On a first face of a substrate 10, which may preferably be flexible, this optoelectronic component includes an integrated photoreceptor circuit able to pick up the light generated, for example, by a light source that is not shown. The photoreceptor circuit thus includes a photosensitive area 1a and a processing unit area 1b in accordance with the embodiment described with reference to FIG. 1a for example.

This photoreceptor circuit is mounted on a first portion 10a of flexible substrate 10 by a flip chip technique. In order to do this, contact pads 2 of the photoreceptor circuit, which include metal bumps as shown in FIG. 2, are electrically connected across corresponding connection pads 12 of the first portion of substrate 10. The connection pads are arranged in the same arrangement and position as the metal bumps of processing unit area 1b of the circuit in two rows.

The electrical connection between the metal bumps and the connection pads of substrate 10 is achieved by thermocompression or using an anisotropic adhesive while applying a force F to the back of processing unit area 1b of the photoreceptor circuit. Owing to the symmetrical arrangement of contact pads 2 with the metal bumps on the side of processing unit area 1b, the contact pressure due to the force F applied to the back of the photoreceptor circuit is uniformly distributed without any mechanical stress on the side of photosensitive area 1a. This photosensitive area is thus left free as floating on one side of the processing unit area.

In addition to the first portion, flexible substrate 10 includes a second end portion 10b, which carries electrical connection terminals 11, and a connecting portion 10c between the first and second portions 10a and 10b. Flexible substrate 10 takes the form of a flexible sheet whose thickness may be of the order of 75 μm. Conductive paths 13, arranged on one or other face of each portion of flexible substrate 10, connect certain connection pads 12 to connection terminals 11. A through aperture 14 is also provided in first portion 10a only opposite photosensitive area 1a of the photoreceptor circuit, given that the circuit is flip chip mounted on the substrate. Aperture 14 allows the photosensitive area to pick up the light directly from a light source or by reflection onto a work surface.

Encapsulation (not shown) of at least processing unit area 1b may be provided to shelter this area from light and to rigidify the first portion of the flexible substrate, while leaving photosensitive area 1a free and without any mechanical stress. This allows an optoelectronic component of small dimensions to be made. Moreover, the flexible substrate with connecting portion 10c enables an adjustment to be made to the second electrical connection portion 10b of the component, relative to the first portion 10a carrying the photoreceptor circuit.

Figure 4:
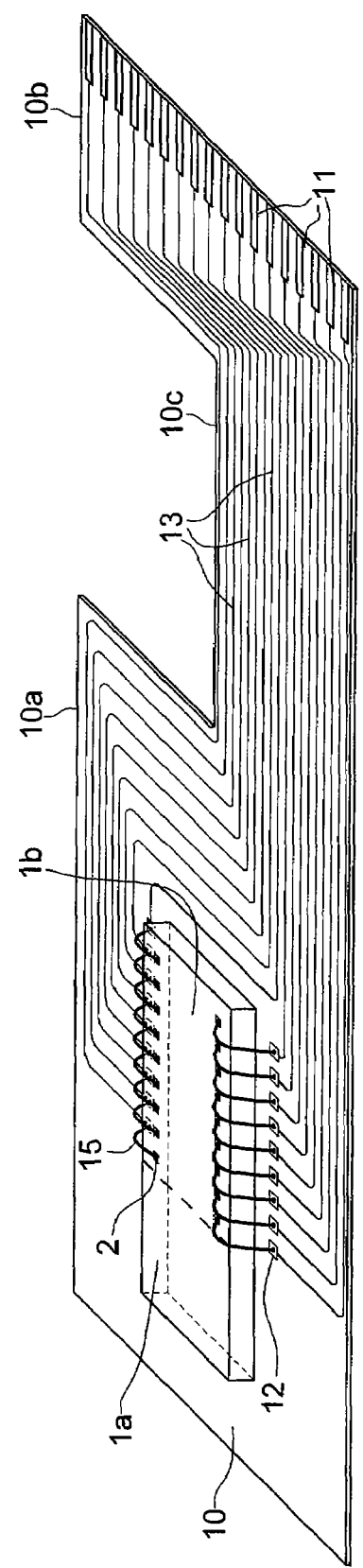
FIG. 4 shows a simplified three-dimensional view of a second embodiment of the optoelectronic component according to the invention.

FIG. 4 shows a three-dimensional view of a second embodiment of the optoelectronic component. This optoelectronic component includes a photoreceptor circuit mounted on a first portion 10a of a flexible substrate 10. The photoreceptor circuit could be the embodiment described with reference to FIG. 1a for example. As in the first embodiment, the substrate includes a second portion 10b, which carries electrical connection terminals 11, and a connecting portion 10c between the first and second portions. The photoreceptor circuit includes a photosensitive area 1a and a processing unit area 1b.

Unlike the first embodiment, the back of the photoreceptor circuit is secured to one face of the first portion 10a of flexible substrate 10. The reception surface of photosensitive area 1a is thus opposite the face securing the photoreceptor circuit to the first portion of substrate 10. Consequently, no through aperture is provided in this first portion 10a.

The first portion 10a of substrate 10 includes two rows of connection pads 12 each arranged on two opposite sides of processing unit area 1 only. These connection pads 12 could be arranged in the same way as contact pads 2 of processing unit area 1b. The electric connection of contact pads 2 is achieved in this second embodiment by metal wires 15, such as aluminium wires, to the corresponding connection pads 12 of first portion 10a of substrate 10. These connection pads 12 are connected to preferably metal conductive paths 13, which are arranged on one or other face of the substrate. The conductive paths thus connect connection pads 12 to connection terminals 11 placed on the second portion 10b of the substrate.

As previously, one could envisage encapsulating only the photosensitive area, either by resin, or by an opaque insulating cover that is not shown. This leaves photosensitive area 1a free without any mechanical stress during the entire method for making the optoelectronic component.

This type of optoelectronic component can be used in any type of electronic instrument, such as an optical computer mouse. In such case, the first substrate portion with the photoreceptor circuit and possibly also a light source circuit, which are protected by a cover, is mounted on a transparent lens unit secured over an aperture of the bottom of the mouse case. The connection terminals of the second substrate portion are directly connected to a mother card remote from the bottom of the case inside the mouse.

From the description that has just been given, several variants of the integrated photoreceptor circuit or optoelectronic component could be devised by those skilled in the art without departing from the scope of the invention defined by the claims. The contact pads of the photoreceptor circuit could be arranged differently, but symmetrically in the processing unit area.

What is claimed is:

1. An integrated photoreceptor circuit including:
   a photosensitive area with several adjacent photosensitive elements for picking up light;
   a processing unit area for processing signals supplied by the photosensitive elements of the photosensitive area; and
   electric contact pads arranged solely on a side of the processing unit area, wherein the processing unit area is juxtaposed with the photosensitive area, wherein the contact pads are arranged symmetrically in the processing unit area, and wherein at least some contact pads are distributed in two rows at a periphery of two opposite sides of the processing unit area so as to be arranged along a length of the two juxtaposed areas.

2. The integrated photoreceptor circuit according to claim 1, wherein all of the contact pads are distributed in the two rows in equal numbers in each row.

3. The integrated photoreceptor circuit according to claim 1, wherein the contact pads of each row are uniformly distributed and regularly spaced from each other over the entire length of each opposite side of the processing unit area.

4. The integrated photoreceptor circuit according to claim 1, wherein the contact pads of each row are grouped to define packets of contact pads, which are uniformly distributed and regularly spaced from each other over the entire length of each opposite side of the processing unit area.

5. The integrated photoreceptor circuit according to claim 1, wherein first contact pads distributed in the two rows are grouped in packets of contact pads that are regularly spaced from each other, and wherein second contact pads are arranged on one side of the processing unit area that is opposite a side connecting the two areas, and the first contact pads and the second contact pads are symmetrically distributed relative to a median line along the length of the integrated photoreceptor circuit.

6. The integrated photoreceptor circuit according to claim 1, wherein metal bumps are made above the contact pads of the photoreceptor circuit to project from a passivation layer on a semiconductor substrate of the photoreceptor circuit.

7. An optoelectronic component including:
   (a) an integrated photoreceptor circuit including:
      i. a photosensitive area with several adjacent photosensitive elements for picking up light;
      ii. a processing unit area for processing signals supplied by the photosensitive elements of the photosensitive area; and
      iii. electric contact pads arranged solely on a side of the processing unit area, wherein the processing unit area is juxtaposed with the photosensitive area, wherein the contact pads are arranged symmetrically in the processing unit area, and wherein at least some contact pads are distributed in two rows at a periphery of two opposite sides of the processing unit area so as to be arranged along a length of the two juxtaposed areas; and
   (b) flexible printed circuit substrate on which the photoreceptor circuit is mounted and is electrically connected, wherein the integrated photoreceptor circuit further includes metal bumps on the contact pads that are connected by means of an assembly force of the circuit on the substrate, applied solely to the back of the processing unit area, to electrical connection pads of a first portion of said substrate, wherein the electrical connection pads have the same arrangement and position as the metal bumps of the integrated photoreceptor circuit.

8. The optoelectronic component according to claim 7, wherein the flexible substrate includes a second portion that carries electrical connection terminals, and a connecting portion disposed between the first and second portions, and conductive paths arranged on a first face, or on a second face, or on the first face and on the second face, of each portion of the flexible substrate, wherein the conductive paths connect certain connection pads to the connection terminals.

9. The optoelectronic component according to claim 7, wherein a through aperture is provided in the first portion opposite the photosensitive area only of the photoreceptor circuit.

* * * * *